(12) United States Patent
Huang et al.

(10) Patent No.: US 11,569,207 B2
(45) Date of Patent: Jan. 31, 2023

(54) LIGHT SOURCE ASSEMBLY, METHOD FOR MAKING SAME, AND DISPLAY DEVICE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Chien-Yu Huang, Chengdu (CN); Po-Lun Chen, Chengdu (CN); Chun-Ta Chen, Chengdu (CN); Po-Ching Lin, Chengdu (CN); Ya-Chu Hsu, Chengdu (CN); Chia-Ming Fan, Chengdu (CN); Ping-Hsiang Kao, Chengdu (CN)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 178 days.

(21) Appl. No.: 17/209,468

(22) Filed: Mar. 23, 2021

(65) Prior Publication Data
US 2022/0199587 A1 Jun. 23, 2022

(30) Foreign Application Priority Data
Dec. 21, 2020 (CN) .......................... 202011520407.9

(51) Int. Cl.
*H01L 25/075* (2006.01)
*H01L 33/00* (2010.01)
(Continued)

(52) U.S. Cl.
CPC ........ *H01L 25/0753* (2013.01); *H01L 33/005* (2013.01); *H01L 33/58* (2013.01);
(Continued)

(58) Field of Classification Search
CPC ... H01L 25/0753; H01L 33/005; H01L 33/58; H01L 2933/0058; G02B 27/0172; G02B 2027/0178
See application file for complete search history.

(56) References Cited

FOREIGN PATENT DOCUMENTS

| CN | 111063720 A | * | 4/2020 | ......... H01L 27/3246 |
|---|---|---|---|---|
| CN | 111834544 A | * | 10/2020 | ......... H01L 27/3246 |
| JP | 08090664 A | * | 4/1996 | |

* cited by examiner

*Primary Examiner* — Mary Ellen Bowman
(74) *Attorney, Agent, or Firm* — ScienBiziP, P.C.

(57) ABSTRACT

A light source assembly, a method for making same, and a display device using same are disclosed. The light source assembly includes a circuit substrate, an opaque and light-reflecting colloidal layer on the circuit substrate, micro light-emitting elements electrically connected to the circuit substrate, a base layer, a layer of convex lenses, and a layer of immediately-adjacent concave lenses. The colloidal layer defines grooves. At least two micro light-emitting elements each emitting light of a different color are arranged in each groove. The base layer is infilled into each groove and covers each micro light-emitting element. Each groove is covered by a convex lens which converges the emitted light. Each concave lens, covering one convex lens, substantially corrects optical path deviations of light of different wavelengths (that is, different colors), so reducing chromatic aberrations.

15 Claims, 9 Drawing Sheets

(51) Int. Cl.
*H01L 33/58* (2010.01)
*G02B 27/01* (2006.01)
(52) U.S. Cl.
CPC .. *G02B 27/0172* (2013.01); *G02B 2027/0178* (2013.01); *H01L 2933/0058* (2013.01)

LIGHT SOURCE ASSEMBLY, METHOD FOR MAKING SAME, AND DISPLAY DEVICE

FIELD

The subject matter herein generally relates to displays, specifically a light source assembly, a method for making the light source assembly, and a display device using the light source assembly.

BACKGROUND

A light source assembly in a micro-projector light machine used for augmented reality glasses (AR Glass) generally includes convex lenses and light-emitting elements that emit light of different colors. Since the convex lens has different refractive indexes for different wavelengths of light (that is, different colors), after passing through the convex lens, different colors of light converge at different focal points on an optical axis of the convex lens, thereby causing chromatic aberration.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
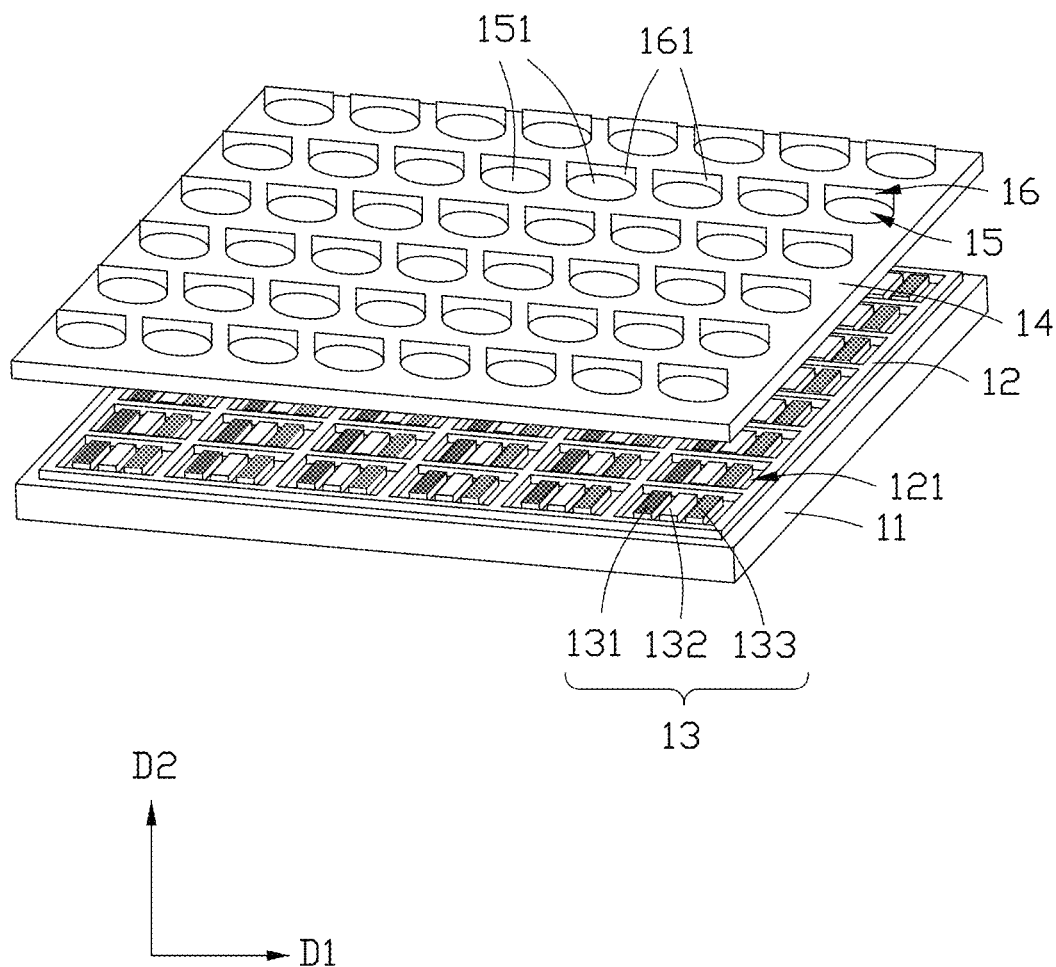
FIG. 1 is a schematic diagram of a light source assembly according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one".

FIG. 1 shows a light source assembly 10a according to a first embodiment. The light source assembly 10a includes a circuit substrate 11, a patterned colloidal layer 12, a plurality of micro light-emitting elements 13, a base layer 14, a convex lens layer 15, and a concave lens layer 16.

In one embodiment, the circuit substrate 11 is a flexible circuit board or a printed circuit board. The circuit substrate 11 includes a driving circuit (not shown). The micro light-emitting elements 13 are electrically connected to the driving circuit and emit light under the driving of the driving circuit.

The colloidal layer 12 is on the circuit substrate 11. The colloidal layer 12 is opaque and light-reflecting. Grid-shaped crisscross ribs formed on a surface of the colloidal layer 12 away from the circuit substrate 11 define a plurality of grooves 121. The micro light-emitting elements 13 are on the circuit substrate 11 and are electrically connected to the circuit substrate 11. At least two micro light-emitting elements 13 emitting light of different colors are installed in each groove 121.

In one embodiment, an area where each groove 121 is located is defined as a pixel unit. A plurality of pixel units is arranged in a matrix including columns along a first direction D1 and rows along a second direction D2. In each pixel unit (i.e., each groove 121), there are three micro light-emitting elements 13 emitting different colors, for example, a red-light emitting element 131, a green-light emitting element 132, and a blue-light emitting element 133. The red-light emitting element 131, the green-light emitting element 132, and the blue-light emitting element 133 in each pixel unit (i.e., each groove 121) are spaced apart from each other along the first direction D1. Thus, the pixel units in the matrix include columns of red-light emitting elements 131, columns of green-light emitting elements 132, and columns of blue-light emitting elements 133. The columns of red-light emitting elements 131, the columns of green-light emitting elements 132, and the columns of blue-light emitting elements 133 are alternatingly arranged along the first direction D1. In the first direction D1, each column of red-light emitting elements 131 alternates with one column of green-light emitting elements 132 and one column of blue-light emitting elements 133. In other embodiments, the micro light-emitting elements 13 in each groove 121 a may also include micro light-emitting elements 13 that emit light of colors other than red, green, and blue. In addition, the arrangement of the micro light-emitting elements 13 in each groove 121 is not limited to the embodiment in FIG. 1 and may be adjusted as needed.

In one embodiment, each micro light-emitting element 13 is a micro inorganic light emitting diode, which has advantages of high brightness, low power consumption, high reliability, and short response time.

In one embodiment, a length of each micro light-emitting element 13 is less than 75 microns, and a width of each micro light-emitting element 13 is less than 75 microns.

In one embodiment, the colloidal layer 12 is opaque and light-reflecting, so that the grooves 121 defined by the colloidal layer 12 function like the interior of a silver cup. The light emitted by the micro light-emitting elements 13 in the grooves 121 cannot leak into the surrounding pixel units, and the light emitted by the micro light-emitting elements 13 in the grooves 121 achieves the effect of being convergent light by being reflected.

In one embodiment, a thickness of the colloidal layer 12 is greater than or equal to a height of each micro light-emitting element 13 so as to converge the light emitted by each micro light-emitting element 13 in each pixel unit. The height of the layer 12 also prevents light from leaking into the surrounding pixel units.

As shown in FIG. 1, the base layer 14 is on a side of the circuit substrate 11 provided with the micro light-emitting elements 13. The base layer 14 infills each groove 121 and covers each micro light-emitting element 13. That is, the base layer 14 is formed on a surface of the circuit substrate 11 and completely fills the gaps between the colloidal layer 12 and the micro light-emitting elements 13. The base layer 14 is shown flat in the drawings, for simplicity.

In one embodiment, a thickness of the base layer 14 is equal to a thickness of the colloidal layer 12. That is, after the base layer 14 is infilled into the groove 121, its surface away from the circuit substrate 11 is flush with the surface of the colloidal layer 12 away from the circuit substrate 11.

Figure 2:
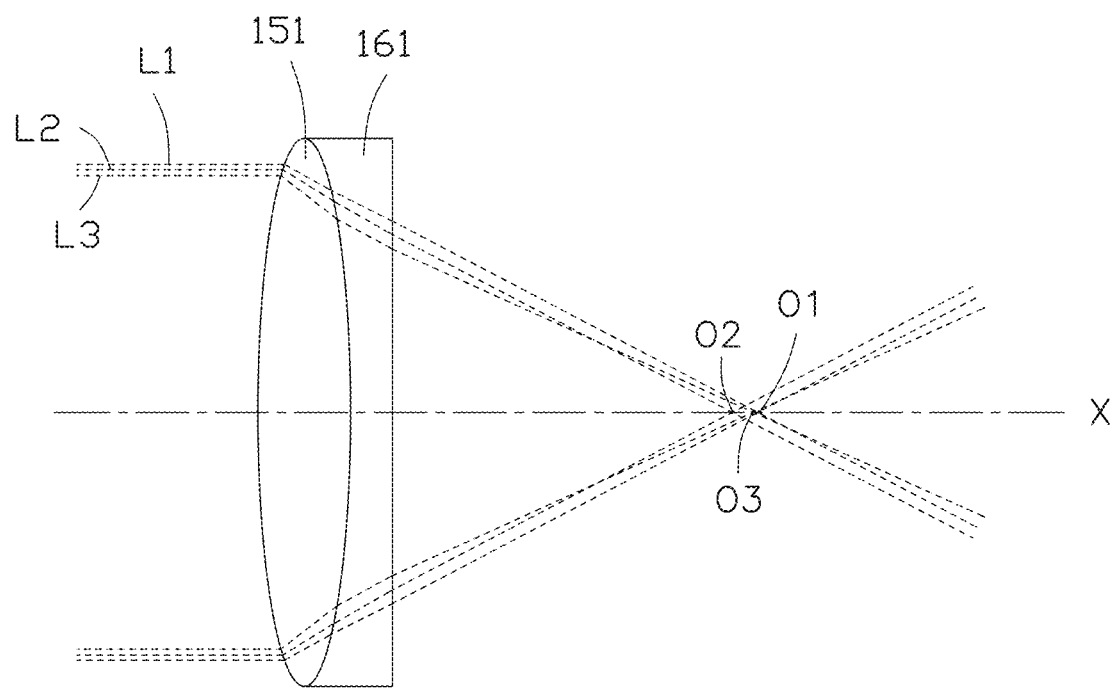
FIG. 2 shows an optical path of the light emitted from the micro light-emitting elements in one groove in FIG. 1 after passing through a convex lens and a concave lens.

As shown in FIG. 1, the convex lens layer 15 is on a surface of the base layer 14 away from the micro light-emitting elements 13. The concave lens layer 16 is on a surface of the convex lens layer 15 away from the base layer 14. The convex lens layer 15 includes a plurality of convex lenses 151 spaced apart from each other. The concave lens layer 16 includes a plurality of concave lenses 161 spaced apart from each other. Each concave lens 161 covers one convex lens 151. Each convex lens 151 is aligned with all the micro light-emitting elements 13 in one groove 121. That is, each concave lens 161 is arranged to correspond to one convex lens 151, and each convex lens 151 covers all the micro light-emitting elements 13 in one groove 121. Each convex lens 151 is used to converge the light emitted by the micro light emitting elements 13 in the groove 121. Each concave lens 161 eliminates optical path differences caused by different degrees of refraction of light of different colors. FIG. 2 shows an optical path of the light emitted from the micro light-emitting elements 13 located in one groove 121 in FIG. 1, after passing through the convex lens 151 and the concave lens 161. FIG. 2 shows the lights of different colors emitted by the three micro light-emitting elements 13 in the same groove 121 defined as L1, L2, and L3. After passing through the convex lens 151, the lights L1, L2, and L3 are converged. After passing through the concave lens 161 covering the convex lens 151, the optical path differences are substantially canceled, so that the lights L1, L2, and L3 have approximately the same focal length after passing through the convex lens 151 and the concave lens 161. FIG. 2 shows the respective focal points of the light L1, L2, and L3, after passing through the convex lens 151 and the concave lens 161 on the optical axis, as being O1, O2, and O3. The focal points O1, O2 and O3 converge onto approximately one single point, thereby improving the chromatic aberration phenomenon.

In FIG. 1, the base layer 14 and the convex lens layer 15 are integrally formed by a single molding process. That is, the base layer 14 and the convex lens layer 15 are an entire layer made of the same material.

In FIG. 1, each concave lens 161 is a plano-concave lens. In other embodiments, each concave lens 161 may be a bi-concave lens.

In one embodiment, a refractive index of each of the base layer 14 and the convex lens layer 15 is in a range of 1.4 to 1.55, so as to further converge the emitted light of the micro light-emitting elements 13. A material of the base layer 14 and the convex lens layer 15 may be silica gel, epoxy resin, or other resin materials.

In one embodiment, a refractive index of the concave lens layer 16 is in a range of 1.5 to 1.7, so as to reduce the optical path differences between lights of different colors. The material of the concave lens layer 16 may be an optical resin such as silica gel, epoxy resin, or an organic-inorganic hybrid material mixed with optical resin, silicon dioxide, and titanium dioxide.

In one embodiment, the refractive indices of each of the base layer 14 and the convex lens layer 15 is in a range of 1.4 to 1.55, and the refractive index of the concave lens layer 16 is in a range of 1.5 to 1.7. The refractive index of the concave lens layer 16 is greater than the refractive index of the base layer 14 and the convex lens layer 15 to reduce the optical path differences between lights of different colors.

Figure 3:
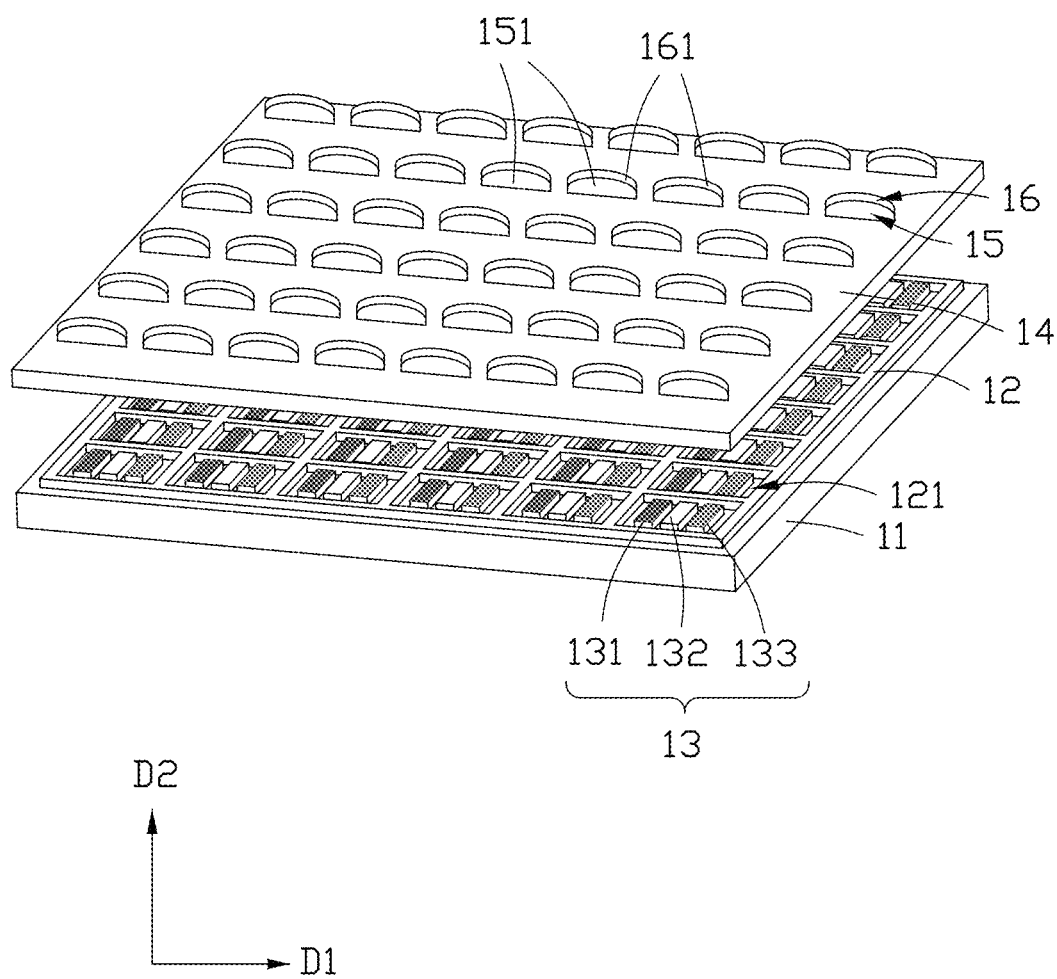
FIG. 3 is a schematic diagram of the light source assembly according to a second embodiment.

FIG. 3 shows a light source assembly 10b according to the second embodiment. The difference between the light source assembly 10b and the light source assembly 10a is that the base layer 14 in the light source assembly 10b is made of an ultraviolet-cured adhesive, and the base layer 14 and the convex lens layer 15 are not integrally formed. That is, in the light source assembly 10b, the base layer 14 and the convex lens layer 15 are obtained by different manufacturing processes, and there are different materials of the base layer 14 and of the convex lens layer 15.

Figure 4:
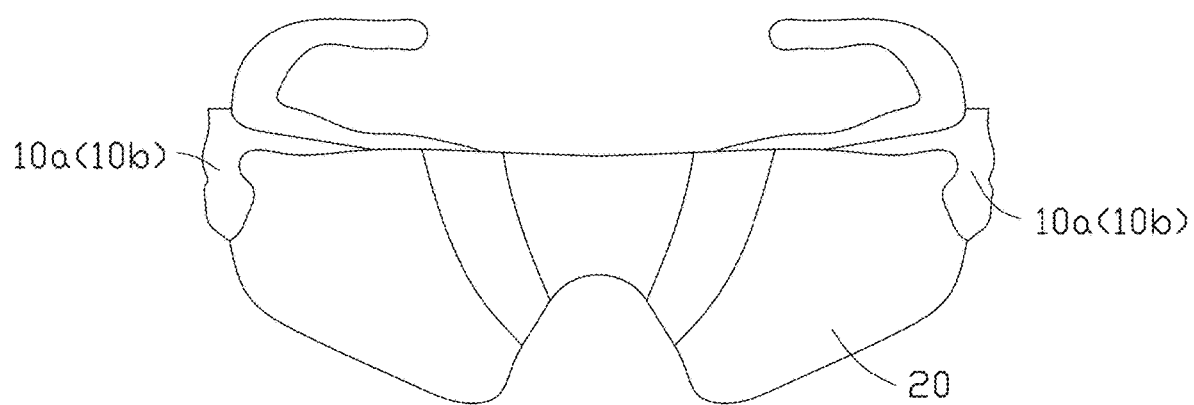
FIG. 4 is a schematic diagram of a display device using the light source assembly according to an embodiment.

FIG. 4 shows a display device 100. The display device 100 is augmented reality display glasses. The display device 100 includes a main body 20 and the light source assembly 10a (or 10b) provided in the main body 20. The main body 20 includes, for example, a frame, a processing unit in the frame, power supply assembly, and the like. The frame body is, for example, a spectacles frame, which can be worn on the head of the user to allow the user's eyes to see images. The light source assembly 10a (or 10b) is installed on the frame and used as a projection light machine of the display device 100.

Since the concave lens layer 16 is provided in the light source assembly 10a (or 10b), chromatic aberration can be eliminated. There is no need for a complicated arrangement of lenses to reduce the chromatic aberration. Therefore, the display device 100 using the light source assembly 10a (or 10b) as the projector has a small space, light weight, and good wearing comfort for the user.

In other embodiments, the display device 100 is not limited to use in augmented reality display glasses. For example, the display device 100 may be a helmet-mounted display device.

Figure 5:
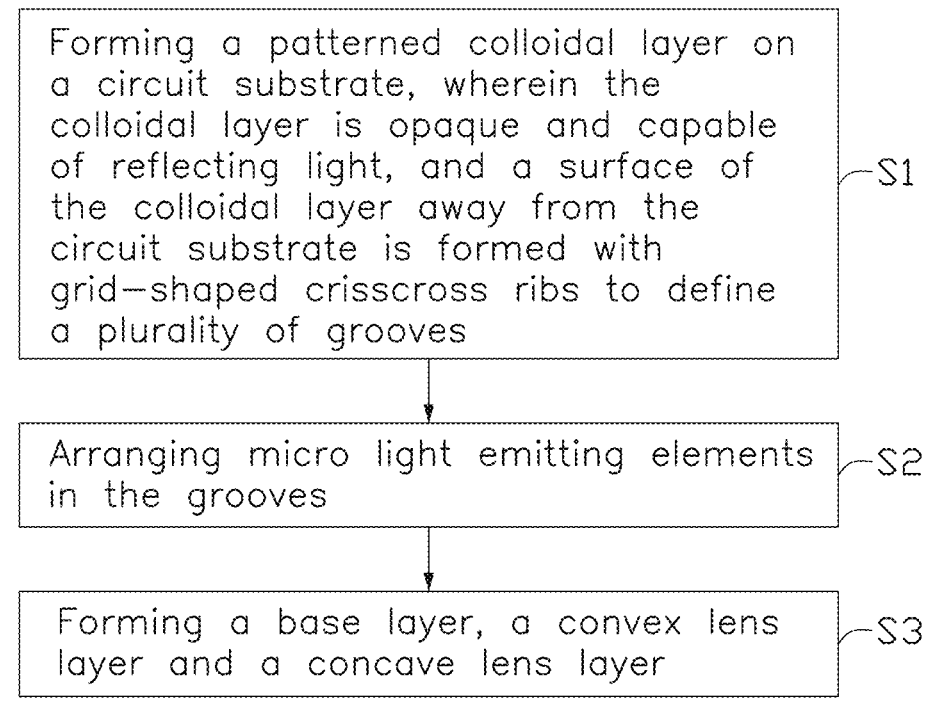
FIG. 5 is a flow chart of a method for making the light source assembly according to an embodiment.

FIG. 5 shows a flowchart of a method for making a light source assembly according to an embodiment. The example method is provided by way of example, as there are a variety of ways to carry out the method. The method described below can be carried out using the configurations illustrated in FIG. 5, for example, and various elements of these figures are referenced in explaining the example method. Each block shown in FIG. 5 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block S1.

At Block S1, a patterned colloidal layer is formed on a circuit substrate, wherein the colloidal layer is opaque and light-reflecting. Grid-shaped crisscross ribs formed on a surface of the colloidal layer away from the circuit substrate define a plurality of grooves.

At Block S2, a plurality of micro light-emitting elements is arranged in the plurality of grooves.

At Block S3, a base layer, a convex lens layer and a concave lens layer are formed.

The method will be described below with reference to FIGS. 6 through 9D.

In one embodiment, at Block S1, an air pressure dispenser or a screw dispenser is used to dispense on the surface of the circuit substrate 11 to form the grid-shaped colloidal layer 12.

In one embodiment, at Block S2, each groove 121 is provided with at least two micro light-emitting elements 13 emitting light of different colors. The micro light-emitting elements 13 emitting light of different colors can be placed on the circuit substrate 11 in sequence. For example, first, the red-light emitting element 131 may be placed in each groove 121, then the green-light emitting element 132 may be placed in each groove 121, and finally the blue-light emitting element 133 may be placed in each groove 121. Each micro light-emitting element 13 is electrically connected to the circuit substrate 11.

The base layer 14 formed in Block S3 infills each groove 121 and covers each micro light-emitting element 13. The convex lens layer 15 is on the surface of the base layer 14 away from the micro light-emitting element 13. The convex lens layer 15 includes a plurality of convex lenses 151 spaced apart from each other, and each convex lens 151 is aligned with all the micro light-emitting elements 13 in one groove 121. The concave lens layer 16 is on the surface of the convex lens layer 15 away from the base layer 14. The concave lens layer 16 includes a plurality of concave lenses 161 spaced apart from each other, and each concave lens 161 covers one convex lens 151. Each convex lens 151 is used to converge the light emitted by the micro light emitting elements 13 in the groove 121 where it is aligned. Each concave lens 161 is used to eliminate optical path differences of light of different colors emitted by the micro light-emitting elements 13 in the groove 121 where the convex lens 151 covered by it is aligned.

In one embodiment, Block S3 includes two molding processes. A first molding process forms the base layer 14 and the convex lens layer 15 at one time. A second molding process forms the concave lens layer 16. One of a compression molding method, a transfer molding method and an injection molding method can be adopted for the two molding processes.

Figure 6:
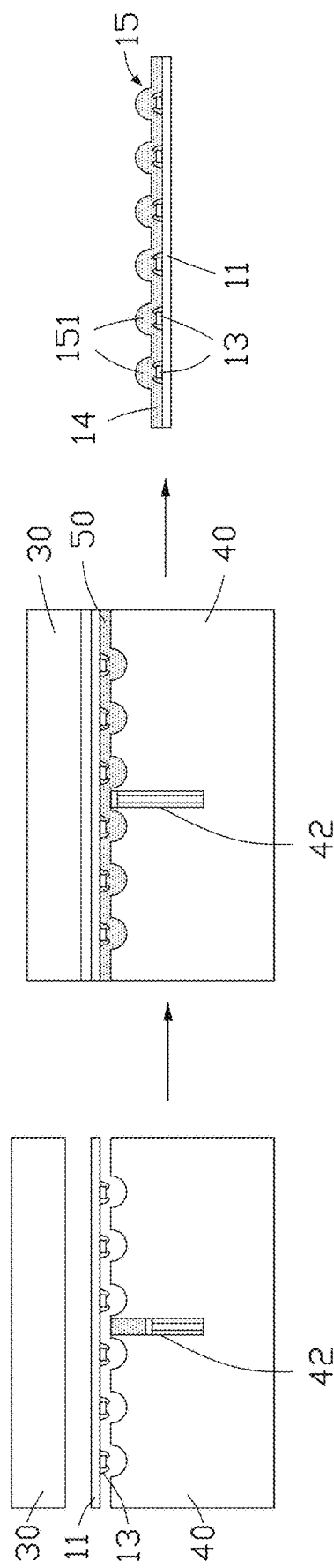
FIG. 6 is a view showing a base layer and a convex lens layer formed by a compression molding method in Block S3 of the method of FIG. 5.

FIG. 6 shows forming the base layer 14 and the convex lens layer 15 by the compression molding method. The colloidal layer 12 is omitted in FIG. 6, for simplicity. As shown in FIG. 6, forming the base layer 14 and the convex lens layer 15 includes spraying a mold release agent (not shown) on a second template 40, placing the circuit substrate 11 provided with the micro light-emitting elements 13 between a first template 30 and the second template 40, injecting a glue 50 into an extrusion rod 42, closing the first template 30 and the second template 40, extrusion and heating, opening the mold, demolding. Then, the base layer 14 and the convex lens layer 15 are formed on the circuit substrate 11.

Figure 7:
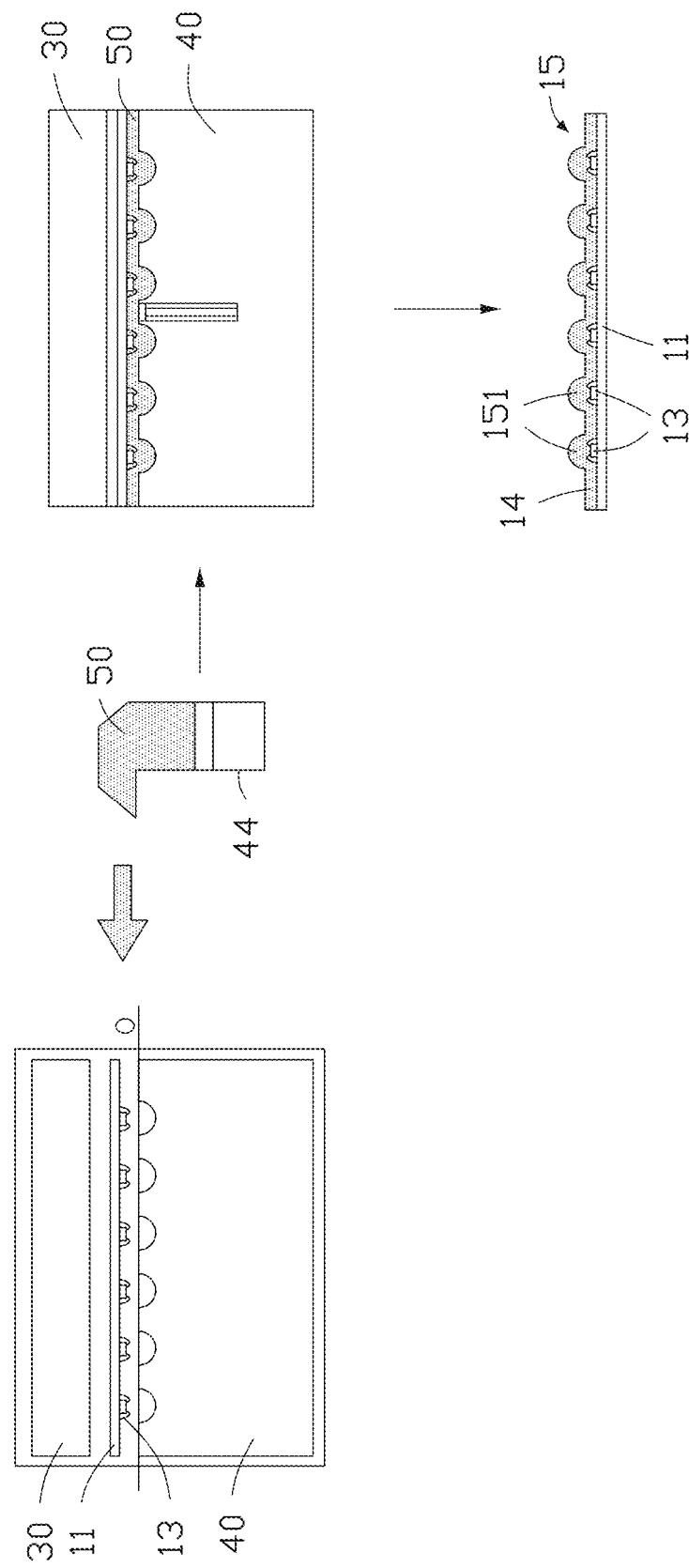
FIG. 7 is a view showing the base layer and the convex lens layer formed by a transfer molding method in Block S3 of the method of FIG. 5.

FIG. 7 shows forming the base layer 14 and the convex lens layer 15 by the transfer molding method. The colloidal layer 12 is omitted in FIG. 7, for simplicity. As shown in FIG. 7, forming the base layer 14 and the convex lens layer 15 includes placing raw materials in a filling chamber, vacuuming, placing the circuit substrate 11 provided with the micro light-emitting elements 13 between the first template 30 and the second template 40, injecting the glue 50 into a glue channel 44, closing the first template 30 and the second template 40, heating, opening the mold, demolding. Then, the base layer 14 and the convex lens layer 15 are formed on the circuit substrate 11.

Figure 8:
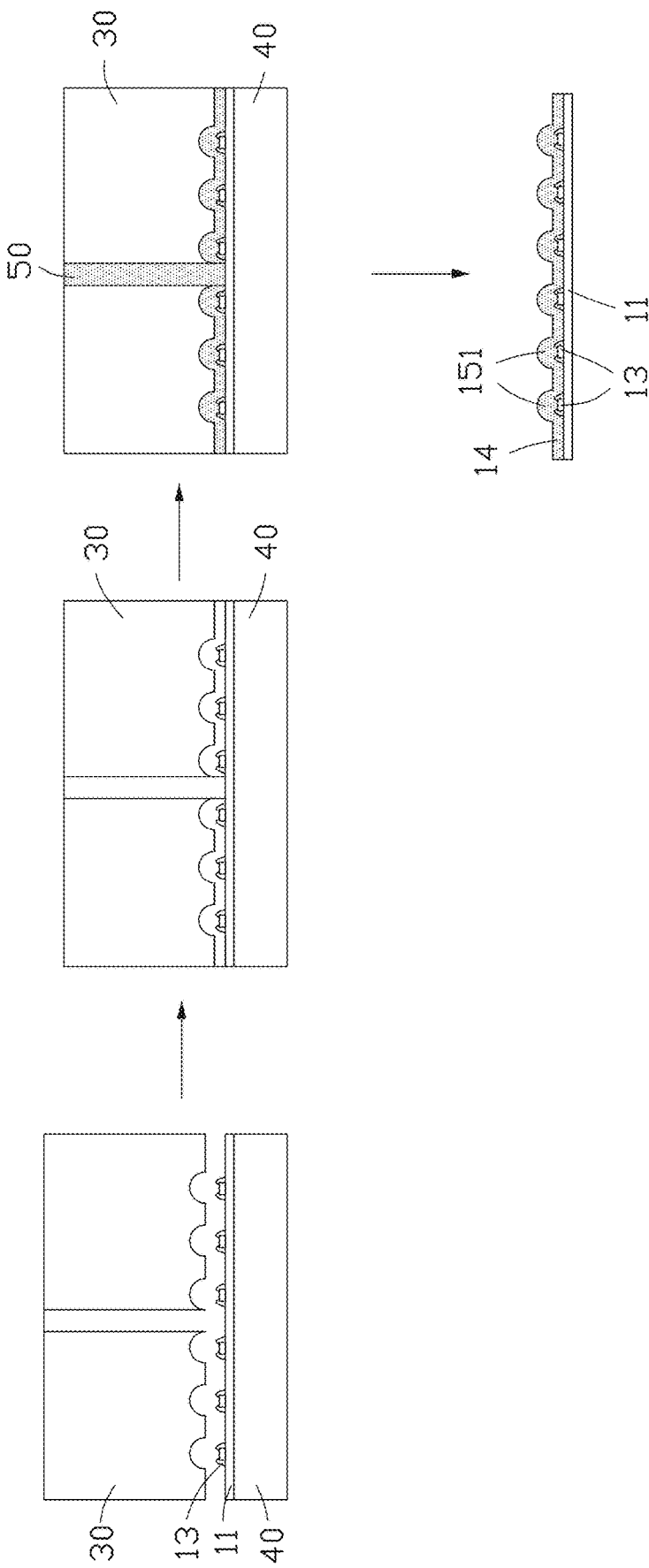
FIG. 8 is a view showing the base layer and the convex lens layer formed by an injection molding method in Block S3 of the method of FIG. 5.

FIG. 8 shows forming the base layer 14 and the convex lens layer 15 by the injection molding method. The colloidal layer 12 is omitted in FIG. 8, for simplicity. As shown in FIG. 8, forming the base layer 14 and the convex lens layer 15 includes placing the circuit substrate 11 provided with the micro light-emitting elements 13 on the second template 40, spraying an adhesive (not shown), closing the first template 30 and the second template 40, injection the glue 50 at one time, heating, opening the mold, and demolding. Then, the base layer 14 and the convex lens layer 15 are formed on the circuit substrate 11.

In addition, at Block S3, the method of forming the concave lens layer 16 on the surface of the convex lens layer 15 is similar to that of forming the base layer 14 and the convex lens layer 15. It can adopt one of the compression molding method, the transfer molding method, and the injection molding method.

In other embodiments, the material of the base layer 14 is made of an ultraviolet-cured adhesive, and the base layer 14 and the convex lens layer 15 are obtained in different manufacturing processes. Block S3 includes attaching an optical adhesive layer (not shown) to the circuit substrate 11 provided with the colloidal layer 12 and the micro light-emitting elements 13, providing a lens array 17, using a transfer head 60 to transfer the lens array 17 to the optical adhesive layer, and curing the optical adhesive layer with ultraviolet light to obtain the base layer 14.

Figure 9A:
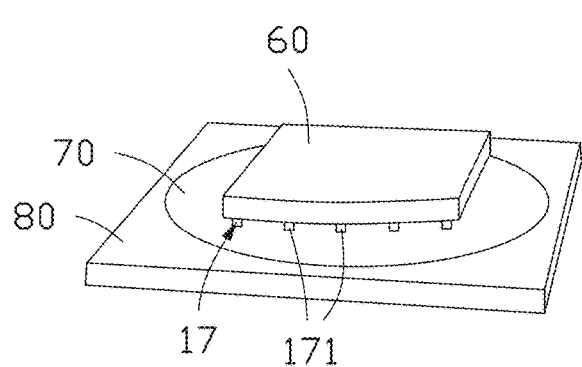
FIG. 9A shows a step of a lens array being attached to a transfer head.
Figure 9B:
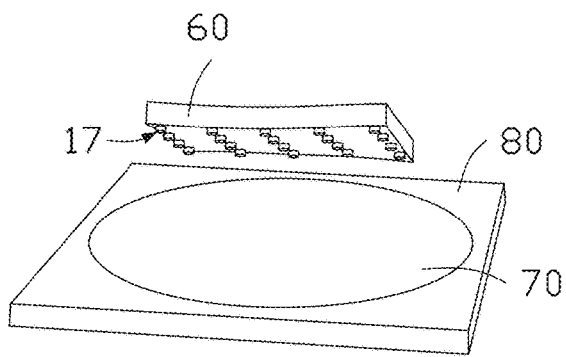
FIG. 9B shows a step of the lens array being transferred from a wafer.

As shown in FIGS. 9A and 9B, the lens array 17 includes a lens group 171 arranged in an array. Each lens group 171 includes a convex lens 151 and a concave lens 161 covering the convex lens 151. In FIG. 9A, the lens array 17 is on a wafer 70, and the wafer 70 is placed on a carrier 80. A blue film (not shown) with low viscosity is provided on the wafer 70. The lens array 17 is on the blue film. The transfer head 60 is a polydimethylsiloxane (PDMS) transfer head. In FIG. 9B, since an adhesion between the transfer head 60 and the lens array 17 is greater than an adhesion between the lens array 17 and the blue film, the lens array 17 is attached to the transfer head 60.

Figure 9C:
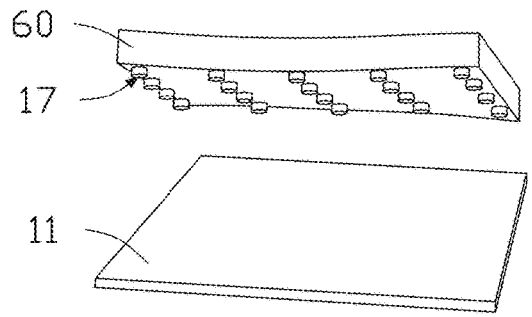
FIG. 9C shows a step of aligning the lens array with a circuit substrate.

As shown in FIG. 9C, the transfer head 60 to which the lens array 17 is attached is above the circuit substrate 11. The circuit substrate 11 is provided with the colloidal layer 12, the micro light-emitting elements 13, and the optical adhesive layer. The colloidal layer 12, the micro light-emitting elements 13, and the optical adhesive layer are omitted in FIG. 9C, for simplicity. In one embodiment, the transfer head 60 is moved so that each lens group 171 in the lens array 17 is aligned with one groove 121 formed by the colloidal layer 12 on the circuit substrate 11.

Figure 9D:
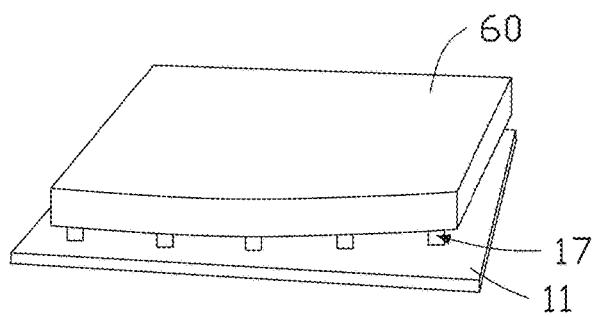
FIG. 9D shows a step of the lens array being attached to the circuit substrate.

As shown in FIG. 9D, after an alignment of the lens groups 171 and the grooves 121 is completed, the transfer head 60 transfers the lens array 17 to the circuit substrate 11. Specifically, the transfer head 60 transfers the lens array 17 to a surface of the optical adhesive layer away from the circuit substrate 11. Each lens group 171 is aligned with all the micro light-emitting elements 13 in one corresponding groove 121. A plurality of the convex lenses 151 constitute the convex lens layer 15, and a plurality of concave lenses 161 constitute the concave lens layer 16. Then, the optical adhesive layer is cured by ultraviolet light to form the base layer 14, and the base layer 14 fills the groove 121 and wraps each micro light-emitting element 13.

In the method for making the light source assembly, each convex lens 151 is covered by one concave lens 161, so that the optical path differences of lights of different colors emitted by the micro light emitting elements 13 in the corresponding groove 121 is eliminated after passing through the convex lens 151 and the concave lens 161. Thus, lights of different colors have approximately the same focal length, and the chromatic aberration is improved.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A light source assembly, comprising:
   a circuit substrate;
   a patterned colloidal layer on the circuit substrate, wherein the colloidal layer is opaque and light-reflecting, and a surface of the colloidal layer away from the circuit substrate is formed with grid-shaped crisscross ribs defining a plurality of grooves;
   a plurality of micro light-emitting elements in the plurality of grooves and electrically connected to the circuit substrate, wherein each of the plurality of grooves is provided with at least two of the plurality of micro light-emitting elements emitting light of different colors;
   a base layer filled in each of the plurality of grooves and covering each of the plurality of micro light emitting elements;
   a convex lens layer on a surface of the base layer away from the plurality of micro light-emitting elements, wherein the convex lens layer comprises a plurality of convex lenses spaced apart from each other, each of the plurality of convex lenses is aligned with one of the plurality of grooves and is configured to converge the light emitted by all the micro light-emitting elements in the one of the plurality of grooves; and
   a concave lens layer on a surface of the convex lens layer away from the base layer, wherein the concave lens layer comprises a plurality of concave lenses spaced apart from each other, and each of the plurality of concave lenses covers one of the plurality of convex lenses and is configured to eliminate optical path differences of the light of different colors emitted by all the micro light-emitting elements in the one of the plurality of grooves.

2. The light source assembly of claim 1, wherein the base layer and the convex lens layer are integrally formed by a single molding process.

3. The light source assembly of claim 1, wherein the base layer is made of an ultraviolet-cured adhesive.

4. The light source assembly of claim 1, wherein a thickness of the colloidal layer is greater than or equal to a height of each of the plurality of micro light-emitting elements.

5. The light source assembly of claim 1, wherein a refractive index of each of the base layer and the convex lens is in a range of 1.4 to 1.55, and a refractive index of the concave lens is in a range of 1.5 to 1.7.

6. The light source assembly of claim 1, wherein a length of each of the plurality of micro light-emitting elements is less than 75 microns, and a width of each of the plurality of micro light-emitting elements is less than 75 microns.

7. A display device comprising a main body and a light source assembly arranged in the main body, wherein the light source assembly comprises:
   a circuit substrate;
   a patterned colloidal layer on the circuit substrate, wherein the colloidal layer is opaque and light-reflecting, and a surface of the colloidal layer away from the circuit substrate is formed with grid-shaped crisscross ribs defining a plurality of grooves;
   a plurality of micro light-emitting elements in the plurality of grooves and electrically connected to the circuit substrate, wherein each of the plurality of grooves is provided with at least two of the plurality of micro light-emitting elements emitting light of different colors;
   a base layer filled in each of the plurality of grooves and defining each of the plurality of micro light emitting elements;
   a convex lens layer on a surface of the base layer away from the plurality of micro light-emitting elements, wherein the convex lens layer comprises a plurality of convex lenses spaced apart from each other, each of the plurality of convex lenses is aligned with one of the plurality of grooves and is configured to converge the light emitted by all the micro light-emitting elements in the one of the plurality of grooves; and
   a concave lens layer on a surface of the convex lens layer away from the base layer, wherein the concave lens layer comprises a plurality of concave lenses spaced apart from each other, and each of the plurality of concave lenses covers one of the plurality of convex lenses and is configured to eliminate optical path differences of the light of different colors emitted by all the micro light-emitting elements in the one of the plurality of grooves.

8. The display device of claim 7, wherein the base layer and the convex lens layer are integrally formed by a single molding process.

9. The display device of claim 7, wherein the base layer is made of an ultraviolet-cured adhesive.

10. The display device of claim 7, wherein a thickness of the colloidal layer is greater than or equal to a height of each of the plurality of micro light-emitting elements.

11. The display device of claim 7, wherein a refractive index of each of the base layer and the convex lens is in range of 1.4 to 1.55, and a refractive index of the concave lens is in a range of 1.5 to 1.7.

12. The display device of claim 7, wherein a length of each of the plurality of micro light-emitting elements is less than 75 microns, and a width of each of the plurality of micro light-emitting elements is less than 75 microns.

13. A method for making a light source assembly, comprising:
forming a patterned colloidal layer on a circuit substrate, wherein the colloidal layer is opaque and light-reflecting, and a surface of the colloidal layer away from the circuit substrate is formed with grid-shaped crisscross ribs defining a plurality of grooves;
arranging a plurality of micro light-emitting elements in the plurality of grooves, wherein the plurality of micro light-emitting elements is electrically connected to the circuit substrate, and each of the plurality of grooves is provided with at least two of the plurality of micro light-emitting elements emitting light of different colors; and
forming a base layer, a convex lens layer and a concave lens layer, wherein the base layer is infilled into each of the plurality of grooves and covers each of the plurality of micro light emitting elements, the convex lens layer is on a surface of the base layer away from the plurality of micro light-emitting elements, the concave lens layer is on a surface of the convex lens layer away from the base layer;
wherein the convex lens layer comprises a plurality of convex lenses spaced apart from each other, each of the plurality of convex lenses is aligned with one of the plurality of grooves and is configured to converge the light emitted by all the micro light-emitting elements in the one of the plurality of grooves;
wherein the concave lens layer comprises a plurality of concave lenses spaced apart from each other, and each of the plurality of concave lenses covers one of the plurality of convex lenses and is configured to eliminate optical path differences of the light of different colors emitted by all the micro light-emitting elements in the one of the plurality of grooves.

14. The method for making the light source assembly of claim 13, wherein forming the base layer, the convex lens layer, and the concave lens layer comprises:
integrally forming the base layer and the convex lens layer by a first molding process; and
forming the concave lens layer by a second molding process.

15. The method for making the light source assembly of claim 13, wherein forming the base layer, the convex lens layer, and the concave lens layer comprises:
attaching an optical adhesive layer to the circuit substrate provided with the colloidal layer and the plurality of micro light-emitting elements;
transferring a lens array to the optical adhesive layer, wherein the lens array comprises a plurality of lens groups arranged in an array, and each of the plurality of lens groups comprises a convex lens and a concave lens covering the convex lens, each of the plurality of lens groups is aligned with one of the plurality of grooves, a plurality of the convex lenses constitutes the convex lens layer, and a plurality of the concave lenses constitutes the concave lens layer; and
curing the optical adhesive layer with ultraviolet light to obtain the base layer.

* * * * *